United States Patent [19]

Nam et al.

[11] Patent Number: 5,765,889
[45] Date of Patent: Jun. 16, 1998

[54] WAFER TRANSPORT ROBOT ARM FOR TRANSPORTING A SEMICONDUCTOR WAFER

[75] Inventors: Sang-Ho Nam, Kyungki-do; Hee-Jung Moon, Suwon, both of Rep. of Korea

[73] Assignee: Samsung Electronics Co., Ltd., Suwon, Rep. of Korea

[21] Appl. No.: 773,491

[22] Filed: Dec. 23, 1996

[30] Foreign Application Priority Data

Dec. 23, 1995 [KR] Rep. of Korea ............ 95-55681

[51] Int. Cl.$^6$ ............................................. B25J 15/06
[52] U.S. Cl. ................................ 294/64.1; 414/941
[58] Field of Search ......................... 294/64.1, 64.3; 269/21; 414/941; 901/40

[56] References Cited

FOREIGN PATENT DOCUMENTS 547899  2/1993  Japan ........................ 414/941
5208389  8/1993  Japan ........................ 414/941

*Primary Examiner*—Johnny D. Cherry
*Attorney, Agent, or Firm*—Jones & Volentine, L.L.P.

[57] ABSTRACT

An arm structure of a wafer transfer robot for transporting a semiconductor wafer by vacuum absorption, comprising a body, a plurality of fingers extending in parallel from respective ends of a main vacuum line formed in the body, a plurality of branch vacuum lines extending from the main vacuum line through the fingers, respectively, and being in communication with the main vacuum line, a plurality of vacuum-absorbing projections provided with openings in communication with the respective branch vacuum lines, and projected upwardly on each upper surface of the fingers, for holding the wafer by vacuum-absorption, and structures for horizontally supporting the wafer on the arm. With this wafer transfer robot arm, the wafer can be stably transported because vacuum leakage does not occur between the arm and the wafer held by a vacuum absorption.

2 Claims, 2 Drawing Sheets

5,765,889

WAFER TRANSPORT ROBOT ARM FOR TRANSPORTING A SEMICONDUCTOR WAFER

BACKGROUND OF THE INVENTION

1. Field of Invention

The present invention relates to a wafer transfer robot for transporting a semiconductor wafer, and more particularly, to improvement in the arm of the wafer transfer robot.

2. Description of the Related Art

Well-known wafer transfer robot systems have been used to transport wafers from one working stage to another working stage in a semiconductor manufacturing process. For example, when wafers in a wafer carrier are provided for a photo aligning process, they are drawn in turn from a wafer carrier by a wafer transfer robot arm and moved to a following stage for aligning the drawn wafers in order. Also, after the photo aligning process, the aligned wafers are unloaded by the robot arm to a spinner equipment.

FIG. 1 A shows a conventional wafer transfer robot arm 100 which has a rectangular body 110 and two fingers 120 extending in parallel from respective ends of the body 110. The arm has a vacuum line 130 which is provided to hold a wafer thereon by vacuum-absorption, and is composed of a main vacuum line 130a formed in the body 110 and two branch vacuum lines 130b extending from the main vacuum line 130a through each of the fingers 120, respectively. The two branch vacuum lines 130b are formed in communication with the main vacuum line 130a. The arm also has two vacuum-absorbing projections 140, each of which is provided with an opening in communication with the branch vacuum line, and which projects upwardly on each upper surface of the fingers 120, for holding the wafer by vacuum-absorption.

When the wafers must be transported by using the above described wafer transfer robot arm, the arm is first positioned to transport the wafers. Then the wafers drawn from a wafer carrier are located and held on the arm one by one to be transported to another working stage. At this time, as shown in FIG. 1B, the wafer 200 (solid line) on the arm is placed and held on the vacuum-absorbing projections 140 by vacuum-absorption without directly contacting the body 110 and the fingers 120. The wafer 200 is then moved to the right or the left direction according to the direction the arm is turning. When the arm reaches the desired stage, the wafer on the arm is removed from the projections 140 by releasing the vacuum-absorption.

However, in the conventional robot arm 100 having the above described construction, when a wafer 200 placed on the arm deviates from the centroid of the arm due to an outside shock or an operator's carelessness, it is tilted on the projections 140, as shown by the dashed line in FIG. 1B. Since the wafer 200 does not adhere closely to the projections 140, vacuum leakage occurs between the tilted wafer and the projections 140. Due to this vacuum leakage, the wafer may fall from the arm and be broken, or may contact the arm, possibly causing wafer contamination.

SUMMARY OF THE INVENTION

It is therefore an object of the present invention to provide an arm of a wafer transfer robot which can stably hold a wafer thereon.

It is another object of the present invention to provide an arm of a wafer transfer robot in which vacuum leakage is prevented between the arm and a wafer held by a vacuum absorption.

According to an aspect of the present invention, there is provided an arm of a wafer transfer robot for transporting a semiconductor wafer by vacuum absorption, comprising: a body; a plurality of fingers, each extending in parallel from respective ends of the body; a main vacuum line formed in the body; a plurality of branch vacuum lines, in communication with the main vacuum line, extending from the main vacuum line through the plurality of fingers, respectively; a plurality of vacuum-absorbing projections provided with openings in communication with the respective branch vacuum lines, and projected upwardly on each upper surface of the fingers, for holding the wafer by vacuum-absorption; and means for horizontally supporting the wafer on the arm.

The supporting means comprises a plurality of pins which are formed on the fingers and on the body. Moreover, a supporting projection may be provided at a connection point where the branch vacuum lines are branched from the main vacuum line and which has an opening in communication with the main vacuum line, so as to horizontally support the wafer by vacuum-absorption in association with the vacuum-absorbing projections. With the above arm, since vacuum pressure does not leak between the vacuum-absorbing projections and the wafer, the arm can stably transport wafers.

BRIEF DESCRIPTION OF THE ATTACHED DRAWINGS

This invention may be understood and its objects will become apparent to those skilled in the art by reference to the accompanying drawing in which.

DESCRIPTION OF THE PREFERRED EMBODIMENTS

Figure 1A:
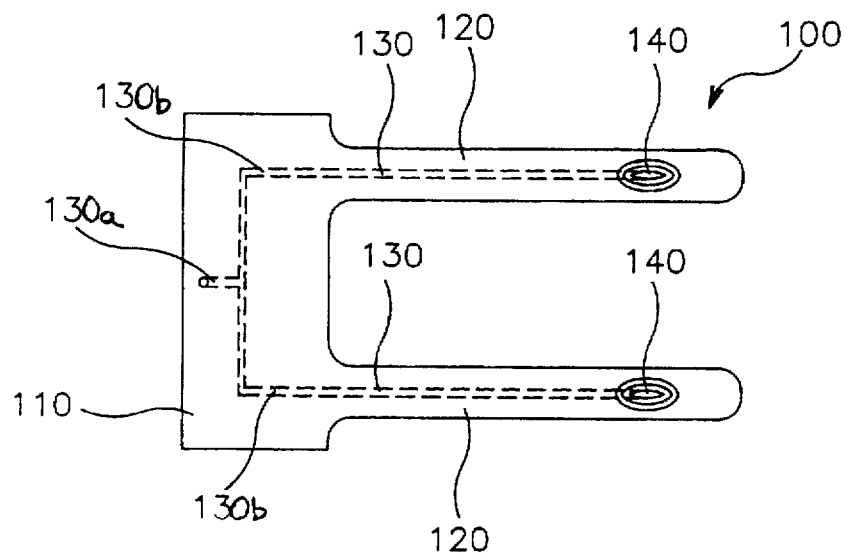
FIG. 1A is a plan view showing an arm of a conventional wafer transfer robot.
Figure 1B:
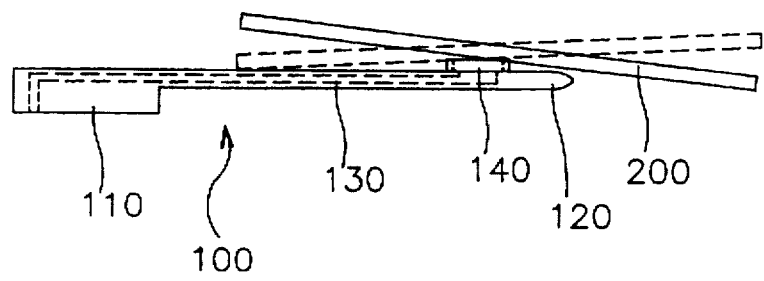
FIG. 1B is a side view showing the arm of the conventional wafer transfer robot on which a wafer is placed.
Figure 2A:
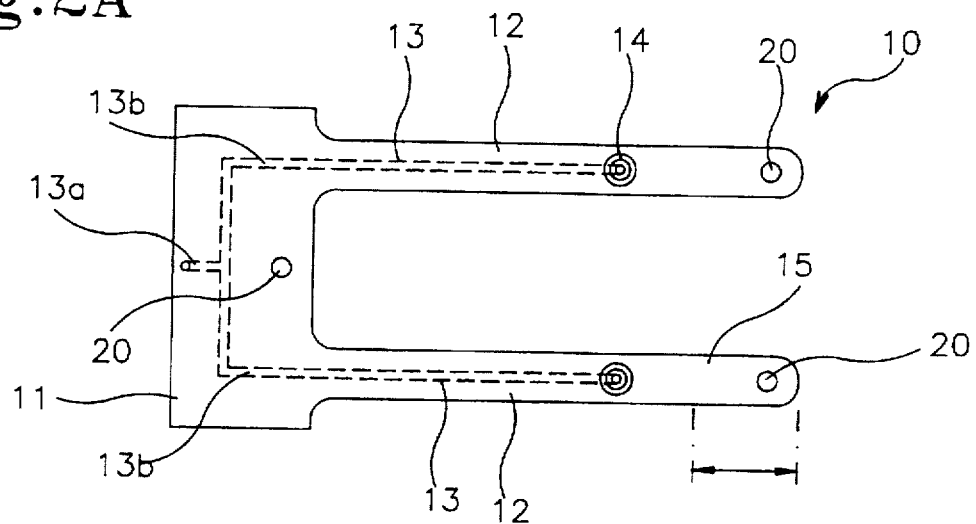
FIG. 2A is a plan view showing a novel wafer transfer robot arm according to an embodiment of the present invention.

FIG. 2A shows a novel wafer transfer robot arm in accordance with an embodiment of present invention, which includes a body 11, two fingers 12 extending in parallel from respective ends of the body 11, and a plurality of pins 20 for horizontally supporting a wafer thereon while the arm holds the wafer by vacuum-absorption.

The arm has a vacuum line 13 which is provided to hold a wafer thereon by vacuum-absorption, and is composed of a main vacuum line 13a formed in the body 11 and two branch vacuum lines 13b extending from the main vacuum line 13a through the fingers 12, respectively. The two branch vacuum lines 13b are formed to communicate with the main vacuum line 13a. The arm also has two vacuum-absorbing projections 14, each of which is provided with an opening in communication with the branch vacuum line 13b, and which projects upwardly on each upper surface of the fingers 12 to hold the wafer by vacuum-absorption.

In this embodiment, three horizontal supporting pins 20 are provided to horizontally support a wafer on the arm while the wafer is held by vacuum-absorption at the vacuum-absorbing projections 14 on the fingers 12. One pin is formed on the body 11, and the remaining pins are formed on the two fingers 12, respectively. The pins on the fingers 12 are spaced apart from the vacuum-absorbing projections 14, respectively. The height of each pin 20 is equal to or less than that of each vacuum-absorbing projections 14.

Figure 2B:
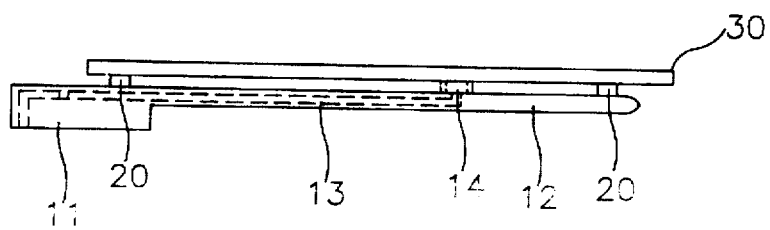
FIG. 2B is a side view showing the novel wafer transfer robot arm on which a wafer is placed.

With an arm having the above structure as shown in FIG. 2B, a wafer 30 on the arm can be placed and held on the vacuum-absorbing projections 14 by vacuum-absorption without directly contacting the body 11 and the fingers 12. This is because the pins 20 horizontally support the wafer on the projections 14, so that the wafer 30 is not tilted. Thus the wafer can be horizontally supported by the pins 20 so that vacuum pressure does not leak between the vacuum-absorbing projections 14 and the wafer 30. Accordingly, the arm of this embodiment can stably transport the wafers.

Figure 3A:
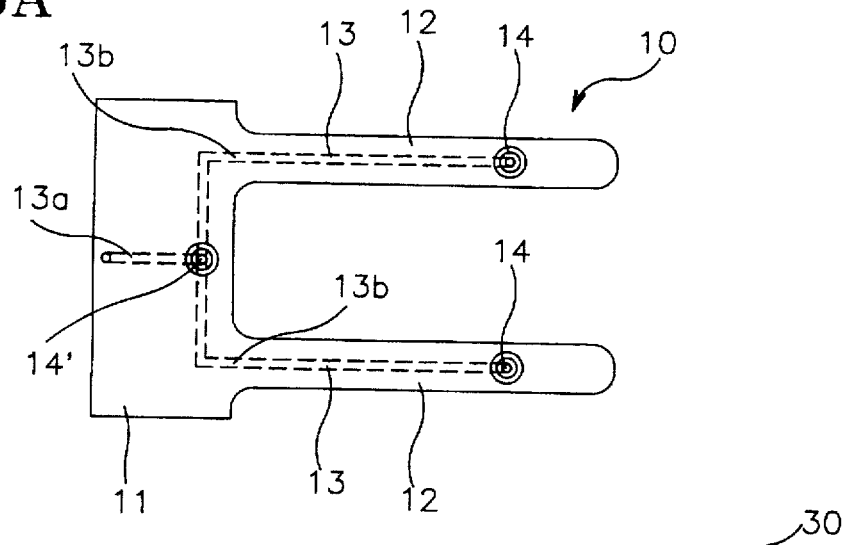
FIG. 3A is a plan view showing a novel wafer transfer robot arm according to another embodiment of the present invention.

FIG. 3A shows a novel wafer transfer robot arm in accordance with another embodiment of the present invention. The arm shown in FIG. 3A is identical in many respects to the structure of the arm shown in FIG. 2A, and hence identical parts are denoted by the same reference numerals to omit redundant description.

Referring to FIG. 3A, the arm includes a body 11, two fingers 12 extending in parallel from respective ends of the body 11, two vacuum-absorbing projections 14 provided upwardly on each upper surface of the fingers 12, and at least one additional projection 14' formed upwardly on the body 11. The additional projection 14' or projections are provided to not only hold a wafer on the arm by vacuum-absorption, but also to horizontally support the wafer.

Figure 3B:
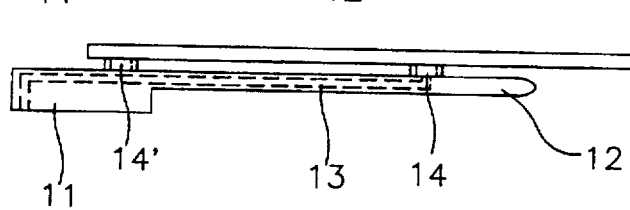
FIG. 3B is a side view showing the novel wafer transfer robot arm on which a wafer is placed.

The arm further includes a vacuum line 13 which is provided to hold a wafer thereon by vacuum-absorption, and composed of a main vacuum line 13a formed in the body 11 and two branch vacuum lines 13b extending from the main vacuum line 13a through the fingers 12, respectively. The two branch vacuum lines 13b are formed in communication with the main vacuum line 13a. The two vacuum-absorbing projections 14 are provided with an opening in communication with the branch vacuum lines 13b, respectively, so as to hold the wafer by vacuum-absorption. The additional projection 14' is also provided with an opening at a vacuum connection point where the branch vacuum lines connect with the main vacuum line. The projection 14' is formed on the body 11 and in communication with the main vacuum line so as to hold the wafer by vacuum-absorption and horizontally support the wafer on the arm in association with the vacuum-absorbing projections 14, as shown in FIG. 3B. The projection 14' has the same height as each of the vacuum-absorbing projections 14.

As stated immediately above, the additional projection 14' is used as means to horizontally and stably supporting a wafer on the arm in association with the vacuum-absorbing projections 14. Thus, vacuum pressure does not leak between the vacuum-absorbing projections and the wafer, and therefore, the arm can stably transport the wafers.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. An arm of a wafer transfer robot for transporting a semiconductor wafer by vacuum absorption, comprising:

a body;

a plurality of fingers, each extending in parallel from respective ends of said body;

a main vacuum line formed in said body;

a plurality of branch vacuum lines, in communication with said main vacuum line, extending from said main vacuum line through said plurality of fingers, respectively;

a first and a second vacuum-absorbing support projection provided with openings in respective communication with each of said plurality of branch vacuum lines, and projected upwardly on each upper surface of said fingers, for simultaneously vacuum-absorbing and horizontally supporting the wafer at said first and second vacuum-absorbing support projections; and a third vacuum-absorbing support projection provided with an opening in communication with said main vacuum line, and disposed at a point where said branch vacuum lines are connected to said main vacuum line, for simultaneously vacuum-absorbing and horizontally supporting the wafer at said third vacuum-absorbing support projection.

2. The wafer transfer robot arm of claim 1, wherein the supporting projection has the same height as each of the vacuum-absorbing projections.

* * * * *